US011145777B2

(12) United States Patent
Lin et al.

(10) Patent No.: US 11,145,777 B2
(45) Date of Patent: Oct. 12, 2021

(54) OPTICAL SENSOR MODULE, METHOD FOR MANUFACTURING THE SAME AND FRAME STRUCTURE THEREOF

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Shih-Chung Huang, New Taipei (TW); Bo-Jhih Chen, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 51 days.

(21) Appl. No.: 16/738,796

(22) Filed: Jan. 9, 2020

(65) Prior Publication Data
US 2020/0235255 A1 Jul. 23, 2020

(30) Foreign Application Priority Data
Jan. 17, 2019 (CN) .......................... 201910044215.6

(51) Int. Cl.
H01L 31/0232 (2014.01)
H01L 31/101 (2006.01)
H01L 31/02 (2006.01)
H05K 5/00 (2006.01)

(52) U.S. Cl.
CPC ...... *H01L 31/101* (2013.01); *H01L 31/02013* (2013.01); *H05K 5/0043* (2013.01)

(58) Field of Classification Search
CPC .................. H01L 23/49541–49565; H01L 23/49838–49844; H01L 23/4952–49531; H01L 23/49811–49816; H01L 2224/16245–1626; H01L 2224/32245–3226; H01L 2224/48245–4826; H01L 23/12–15; H01L 23/49503–49513
See application file for complete search history.

(56) References Cited

U.S. PATENT DOCUMENTS

| 2005/0186710 A1* | 8/2005 | Moyer | .................. G06F 3/0421 438/116 |
| 2019/0198454 A1* | 6/2019 | Talledo | ............... H01L 23/3114 |
| 2020/0185234 A1* | 6/2020 | Ancheta | ................ H01L 21/561 |

* cited by examiner

*Primary Examiner* — Calvin Y Choi
(74) *Attorney, Agent, or Firm* — Li & Cai Intellectual Property (USA) Office (57) ABSTRACT

An optical sensor module includes a first frame set, a second frame set and a housing which partially covers the first frame set and the second frame set. The first frame set has a first chip-mounting frame and a first wiring frame. The first chip-mounting frame has a first chip-mounting section, and a first conductive lead. At least one first indentation is formed on the first chip-mounting section. The second frame set has a second chip-mounting frame and a second wiring frame. The second chip-mounting frame has a second chip-mounting section and a second conductive lead. At least one second indentation is formed on the second chip-mounting section.

17 Claims, 10 Drawing Sheets

OPTICAL SENSOR MODULE, METHOD FOR MANUFACTURING THE SAME AND FRAME STRUCTURE THEREOF

CROSS-REFERENCE TO RELATED PATENT APPLICATION

This application claims the benefit of priority to China Patent Application No. 201910044215.6, filed on Jan. 17, 2019, in the People's Republic of China. The entire content of the above-identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical sensor module, and more particularly to an optical sensor module, such as a micro photo-interrupter, with the frame structure and method for manufacturing the optical sensor module.

BACKGROUND OF THE DISCLOSURE

An optical sensor module includes a light emitting element for emitting an IR (infrared) light, and an optical sensing module for receiving the reflected IR light, so as to function as an optical switch when a light signal is shielded by an object, which can detect, for example, the moving condition and amount . . . etc. of paper of multi-function machine. Therefore, the functions of the multi-function machine can be ensured to perform normally.

A common problem of the optical sensor module is that light from a light emitting element is directly leaked to a neighboring optical sensor, and results in a dark current which increases noises (interference signals), or even results in malfunction or misuse occur due to cross-talk or other interference. Additionally, the combining strength between the insulating housing and a lead frame of the optical sensor module is not enough, so that peeling easily occurs between the insulating housing and the lead frame.

SUMMARY OF THE DISCLOSURE

In response to the above-referenced technical inadequacies, the present disclosure provides a frame structure of the optical sensor module, which can increase the combining strength between the housing and the frame of the optical sensor module.

In one aspect, the present disclosure provides a frame structure of the optical sensor module, which includes a first frame set, and a second frame set. The first frame set includes a first chip-mounting frame and a first wiring frame. The first chip-mounting frame has a first chip-mounting section, and a first conductive lead extending from the first chip-mounting section along a longitudinal direction. The first wiring frame has a first wiring section, and a first transmitting lead extending from the first wiring section along the longitudinal direction. At least one first indentation is formed on the first chip-mounting section. The second frame set has a second chip-mounting frame and a second wiring frame. The second chip-mounting frame has a second chip-mounting section and a second conductive lead extending from the second chip-mounting section. The second wiring frame has a second wiring section and a second transmitting lead extending from the second wiring section along the longitudinal direction. At least one second indentation is formed on the second chip-mounting section.

Further, in response to the above-referenced technical inadequacies, the present disclosure provides an optical sensor module which reduces interference signals, increases the combining strength between a housing and a frame structure, and enhances the moisture-proof ability.

In another aspect, the present disclosure provides an optical sensor module, which includes a first frame set, a light source element, a second frame set, a light detector and a housing. The first frame set includes a first chip-mounting frame, and a first wiring frame. The first chip-mounting frame has a first chip-mounting section, and a first conductive lead extending from the first chip-mounting section along a longitudinal direction. The first wiring frame has a first wiring section, and a first transmitting lead extending from the first wiring section along the longitudinal direction. At least one first indentation is formed on the first chip-mounting section. The light source element is mounted on the first chip-mounting section of the first chip-mounting frame. The second frame set has a second chip-mounting frame and a second wiring frame. The second chip-mounting frame has a second chip-mounting section and a second conductive lead extending from the second chip-mounting section along the longitudinal direction. The second wiring frame has a second wiring section and a second transmitting lead extending from the second wiring section along the longitudinal direction. At least one second indentation is formed on the second chip-mounting section. The light detector is mounted on the second chip-mounting section of the second chip-mounting frame. The housing defines a first transparent window and a second transparent window. The first transparent window is corresponding to the light source element and the second transparent window is corresponding to the light detector.

In addition, in response to the above-referenced technical inadequacies, the present disclosure further provides a method of manufacturing an optical sensor module, which can reduce interference signals, increase the combining strength between the housing and the frame structure, and enhance the moisture-proof ability.

In yet another aspect, the present disclosure provides a method of manufacturing an optical sensor module, including steps as follows:

a stamping step, stamping a metal sheet to form a joint frame, a first frame set, and a second frame set; wherein the first frame set includes a first chip-mounting frame and a first wiring frame, and the second frame set includes a second chip-mounting frame and a second wiring frame; wherein the joint frame forms a plurality of retaining tabs protruding inward;

an injection molding step, forming an insulated material to a housing by injection molding, the housing partially covering the first frame set and the second frame set, to define a first compartment, a second compartment and form a partition wall between the first compartment and the second compartment, wherein the housing covers the plurality of retaining tabs, and the retaining tabs insert sides of the housing;

a trimming and forming step, separating the first frame set and the second frame set away the joint frame;

a bonding and wiring step, disposing a light source element on the first chip-mounting frame of the first frame set, disposing a light detector on the second chip-mounting frame of the second frame set, and wiring to connect the light source element to the first wiring frame, and connecting the light detector to the second wiring frame;

an encapsulating step, filling a first encapsulating material in the first compartment, and filling a second encapsulating material in the second compartment; and a separating step, pushing the housing away from the retaining tab of the joint frame.

In addition, in response to the above-referenced technical inadequacies, the present disclosure further provides an optical sensor module which reduces interference signals, increases the combining strength between a housing and a frame structure, and enhances the moisture-proof ability.

In one aspect, the present disclosure provides an optical sensor module, which includes a first frame set, a light source element, a second frame set, a light detector, and a housing. The first frame set includes a first chip-mounting frame and a first wiring frame. The first chip-mounting frame has a first chip-mounting section, and a first conductive lead extending from the first chip-mounting section along a longitudinal direction. The first wiring frame has a first wiring section, and a first transmitting lead extending from the first wiring section along the longitudinal direction. The light source element is mounted on the first chip-mounting section of the first chip-mounting frame. The second frame set includes a second chip-mounting frame, and a second wiring frame. The second chip-mounting frame has a second chip-mounting section and a second conductive lead extending from the second chip-mounting section along the longitudinal direction. The second wiring frame has a second wiring section and a second transmitting lead extending from the second wiring section along the longitudinal direction. The light detector is mounted on the second chip-mounting section of the second chip-mounting frame. The housing forms a first compartment, a second compartment, and a partition wall. The first chip-mounting section is exposed to the first compartment, and the second chip-mounting section is exposed to the second compartment. The partition wall is positioned between the first compartment and the second compartment. The top surface of the partition wall has a width smaller than a width of a root portion of the partition wall. The root portion of the partition wall extends outward to form a plurality of stepped portions and partially covers a top surface of the first chip-mounting section, a top surface of the second chip-mounting section, a top surface of the first wiring section and a top surface of the second wiring section. A maximum distance between the stepped portions located at bottom and opposite sides of the partition wall is larger than a width of the root portion of the partition wall.

Therefore, the present disclosure has the following advantages. The optical sensor module of the present disclosure can prevent the IR light from leaking outside, reduce the interference signals of dark current, and increase the signal-to-noise ratio, so that the interference signals and the errors detected can be reduced. In addition, the frame structure of the present disclosure can increase the combining strength between the housing and the frame structure. Further, the structure of the housing of the present disclosure can block light, and establish a relatively long, tortuous moisture path, so as to slow down the intrusion of moisture, enhance the moisture-proof ability, and extend product life.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
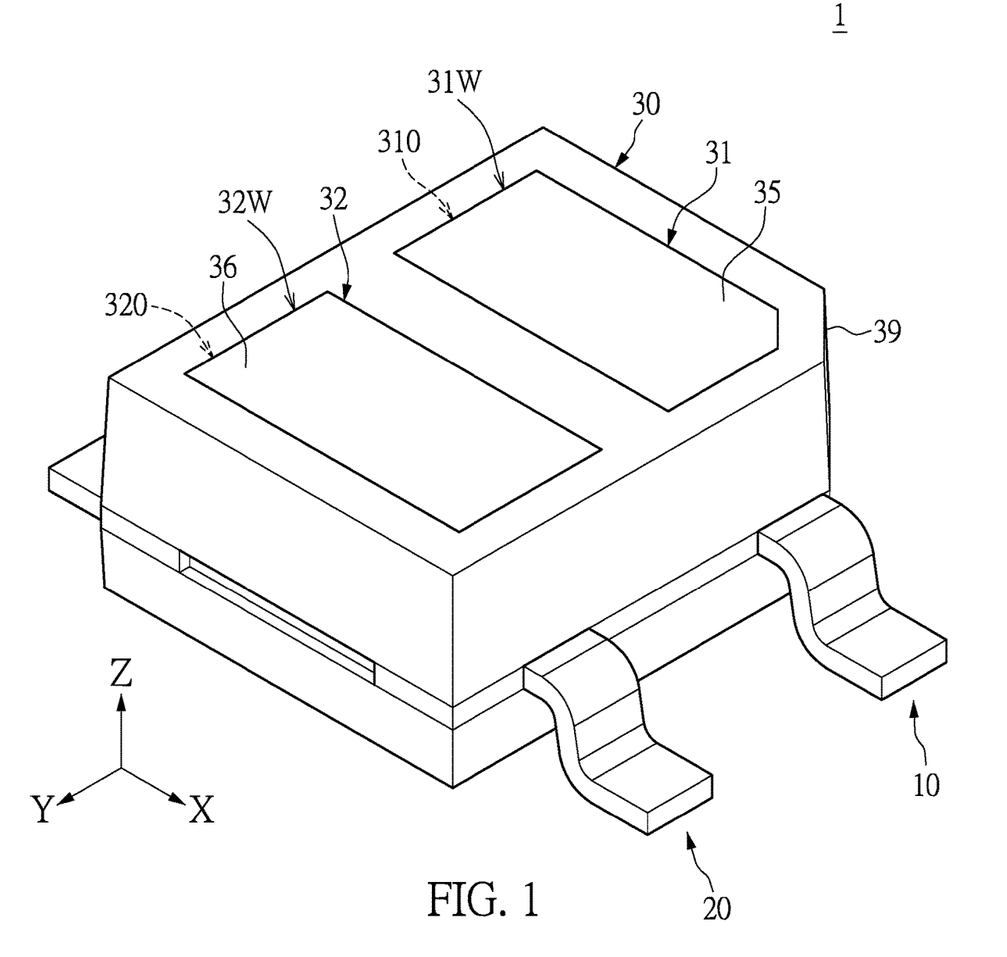
FIG. 1 is a perspective view of an optical sensor module according to the present disclosure.
Figure 2:
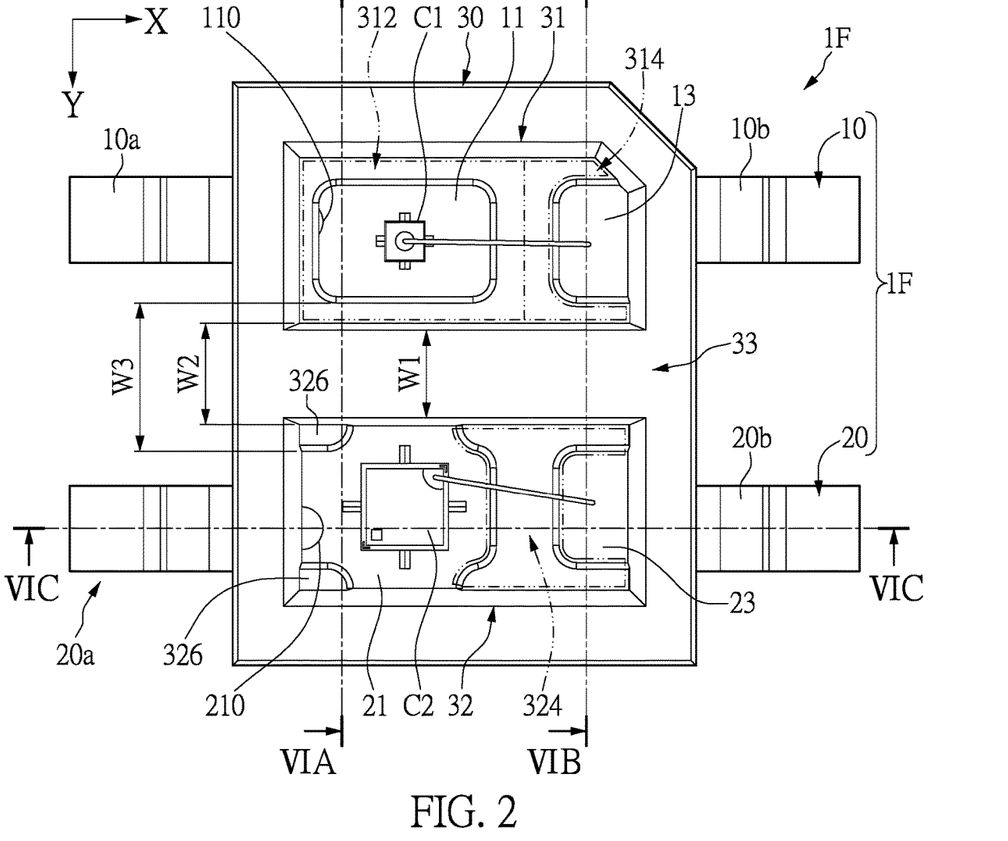
FIG. 2 is a top view of the optical sensor module according to the present disclosure.
Figure 3:
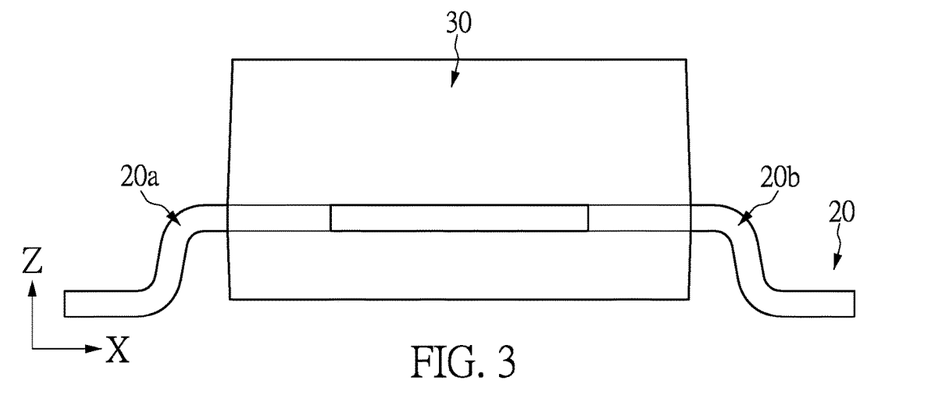
FIG. 3 is a side view of the optical sensor module according to the present disclosure.

Reference is made to FIG. 1 to FIG. 3, which respectively illustrates a perspective view, a top view and side view of an optical sensor module according to the present disclosure. The optical sensor module 1 can be applied to an optoelectronic component. The optoelectronic component may, for example, a photo-interrupter, which includes a first frame set 10, a light source element C1, a second frame set 20, a light detector C2 and a housing 30 with separate first and second compartments 31, 32 respectively. The first and second compartments 31 and 32 are separated by a partition wall 33, which in one embodiment is integrally molded to the remainder of housing 30. That is, the housing 30 defines the first compartment 31 and the second compartment 32, and a first and a second transparent windows 31W and 32W can be provided by forming a first and a second apertures 310 and 320 in the housing 30. The housing 30 may be formed of a material that is opaque to radiation emitted from the light source element C1. For example, it may block the transmission of infrared and/or near infrared radiation. The housing 30 in a preferred implementation may be opaque to all radiation in and/or around the visible spectrum, for example, being formed of optically opaque thermoplastic molding material.

The light source element C1, such as a light-emitting chip, is positioned in the first compartment 31 and adapted for emitting light. The light detector C2, such as a light-detecting chip, is positioned in the second compartment 32 and adapted for sensing a light beam. The light source element C1 can be an emitter such as an IR light emitting diode (LED) or laser diode, and preferably is operating a radiation wavelength of approximately 940 nm. The light detector C2 can be a receiver, such as a photosensor, phototransistor (PT) or Photodiode (PD). A first encapsulating material 35 is filled in the first compartment 31, and a second encapsulating material 36 is filled in the second compartment 32. Each of the first and the second encapsulating materials 35, 36 is formed of transparent or light-penetrable material, which is selected from one of epoxy resin, silicone and polymethylmethacrylate. The encapsulating materials are not shown in FIG. 2 for conveniently showing the interior structure. The above-mentioned "light-penetrable" means infrared light can pass through, and is not limited to colorless transparent, so that any material is applicable that allows light passing through. A corner of the housing 30 further forms an identification portion 39, which is a notch or an unfilled corner in this explanatory embodiment.

Figure 4:
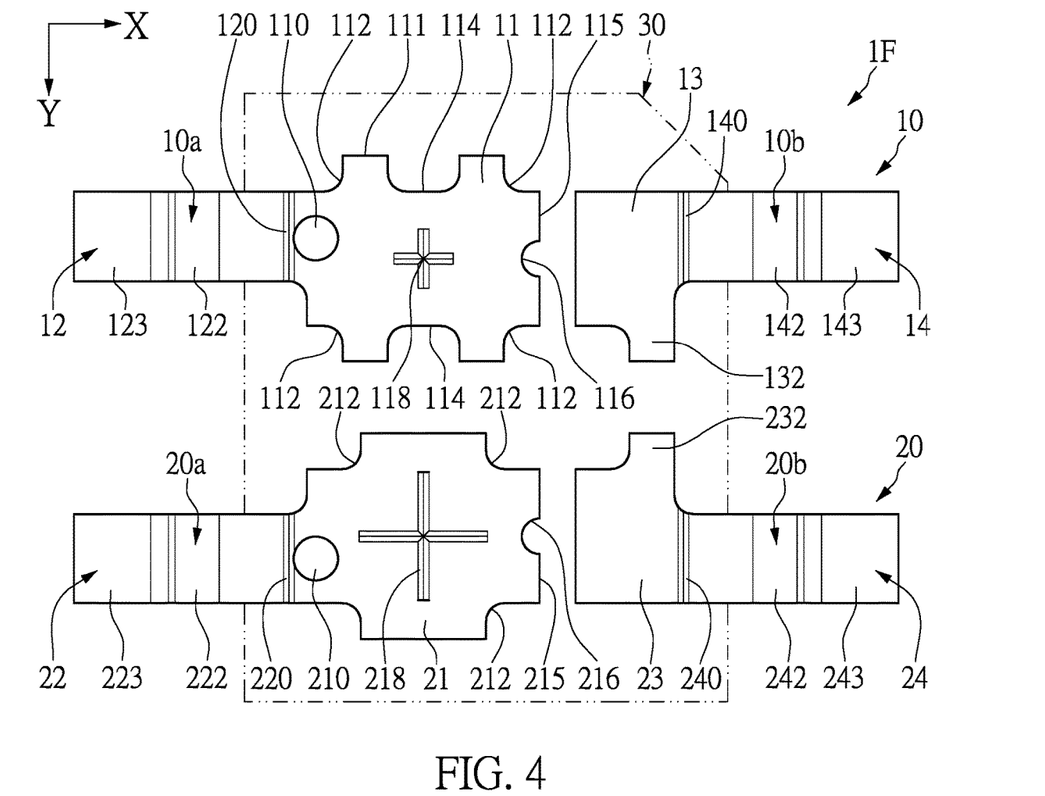
FIG. 4 is a top view of a frame structure of the optical sensor module according to the present disclosure.
Figure 5:
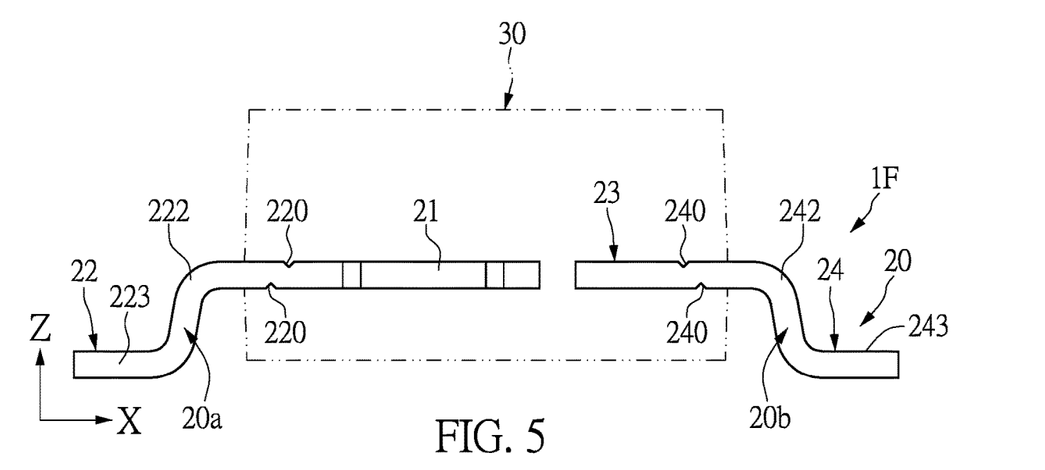
FIG. 5 is a side view of the frame structure of the optical sensor according to the present disclosure.

Reference is made to FIG. 4 to FIG. 5, which respectively illustrate a top view and a side view of a frame structure of the optical sensor module according to the present disclosure. The frame structure 1F includes a first frame set 10 and a second frame set 20. In this embodiment, the first frame set 10 and the second frame set 20 are made from stamping and bending the lead frame from a flat metal plate. The first frame set 10 includes a first chip-mounting frame 10a and a first wiring frame 10b. The first chip-mounting frame 10a has a first chip-mounting section 11, and a first conductive lead 12 extending from the first chip-mounting section 11 along the longitudinal direction. The longitudinal direction in this embodiment means an extending direction of the lead, that is X-axis direction as shown in FIG. 2. The first wiring frame 10b has a first wiring section 13, and a first transmitting lead 14 extending from the first wiring section 13 along the longitudinal direction. The first chip-mounting frame 10a and the first wiring frame 10b are spaced from each other by a distance. Each corner of the first chip-mounting section 11 is formed with a first indentation 112. In this embodiment, the first chip-mounting section 11 is substantially rectangular-shaped and has four first indentations 112 (e.g., an arc notch), to which the present disclosure is not limited. The light source element C1 is mounted on the first chip-mounting section 11 of the first chip-mounting frame 10a.

The first chip-mounting section 11 has two longitudinal side edges 111 which are parallel to the longitudinal direction (refer to X-axis of FIG. 4) and a transverse side edge 115 faced the first wiring frame 10b. Each longitudinal side edge 111 of the first chip-mounting section 11 forms a side indentation 114 (e.g., a U-shaped notch), so that the first chip-mounting section 11 is formed in a double-cross shape. In this embodiment, the first indentation 112 and the side indentation 114 not only reduce the amount of metal material used, but also increase the combining strength between the first frame set 10 and the housing 30. However, this embodiment can omit the side indentation 114, and the first chip-mounting section 11 is formed in a substantial cross shape.

The second frame set 20 includes a second chip-mounting frame 20a and a second wiring frame 20b. The second chip-mounting frame 20a has a second chip-mounting section 21, and a second conductive lead 22 extending from the second chip-mounting section 21 along the longitudinal direction (refer to X-axis of FIG. 4). The light detector C2 is mounted on the second chip-mounting section 21 of the second chip-mounting frame 20a. The second wiring frame 20b has a second wiring section 23 and a second transmitting lead 24 extending from the second wiring section 23 along the longitudinal direction. The second chip-mounting frame 20a and the second wiring frame 20b are spaced a distance apart. Each corner of the second chip-mounting section 21 forms a second indentation 212 (e.g., an arc notch). In this embodiment, the second chip-mounting section 21 is substantially rectangular-shaped which has four of the second indentations 212, so that the second chip-mounting section 21 is formed in a shape of a cross. In a similar way, the second indentations 212 can enhance the combination of the second frame set 20 and the housing 30. Dashed-dotted lines in FIG. 4 and FIG. 5 indicates a region which the housing 30 is formed, and the region covers a portion of the first chip-mounting section 11, the second chip-mounting section 21, the first wiring section 13 and the second wiring section 23.

In this embodiment, the first conductive lead 12 forms a bending section 122, and the first transmitting lead 14 forms a bending section 142. A free end of the first conductive lead 12 has a first connecting section 123, and a free end of the first transmitting lead 14 has a second connecting section 143, which are a terminal portion provided for soldering. The first and second connecting sections 123, 143 are slightly lower than a bottom surface of the housing 30, and are not coplanar with the first chip-mounting section 11. The second conductive lead 22 has a bending section 222, and the second transmitting lead 24 has a bending section 242. A free end of the second conductive lead 22 forms a third connecting section 223, and a free end of the second transmitting lead 24 forms a fourth connecting section 243. Referring to FIG. 5, the third and fourth connecting sections 223, 243 are slightly lower than a bottom surface of the housing 30, and are not coplanar with the second chip-mounting section 21. The double-cross-shaped first chip-mounting section 11, and the cross-shaped second chip-mounting section 21 form an upward protruding configuration, which can improve the combining strength between the housing 30 and the first chip-mounting frame 10a and the second chip-mounting frame 20a.

In addition, to further increase the strength of combination, the transverse side edge 115 of the first chip-mounting section 11 further forms a third indentation 116, such as a semicircular notch. The third indentation 116 faces the first wiring section 13 of the first wiring frame 10b. In a similar arrangement, the second chip-mounting section 21 has a transverse side edge 215, and the transverse side edge 215 further forms a fourth indentation 216, such as a semicircle-shaped notch. The fourth indentation 216 faces the second wiring section 23 of the second wiring frame 20b. Such the third indentation 116 and the fourth indentation 216 are similar to the first and second indentations 112, 212 produced in interface between the housing 30 and the first chip-mounting section 11 and can increase the combining strength.

Moreover, in order to increase the combining strength of the housing 30 between the first wiring frame 10b and second wiring frame 20b, the first wiring frame 10b has a first protrusion 132 which can be a part of the first wiring section 13 and protrudes from the first wiring section 13 toward the second wiring frame 20b, thus the first wiring frame 10b is substantially L-shaped. In addition, the second wiring frame 20b can form a second protrusion 232 correspondingly. In detail, the second protrusion 232 can be a part of the second wiring section 23 and protrudes from the second wiring section 23 toward the first wiring frame 10b, thus the second wiring frame 20b is substantially L-shaped. It should be appreciated that various geometric configurations of the first wiring frame 10b and the second wiring frame 20b can increase combining strength. Therefore, such arrangement can enhance the effect of combining strength, and avoid a peeling between the housing 30 and the first wiring frame 10b, or between the housing 30 the second wiring frame 20b.

With reference to FIG. 4 and FIG. 5, in order to improve the moisture-resistant property of the optical sensor module, an upper surface and a lower surface of the first chip-mounting frame 10a are each formed with a first groove 120. The first groove 120 of the first chip-mounting frame 10a is arranged between the first chip-mounting section 11 and the first conductive lead 12. An upper surface and a lower surface of the first wiring frame 10b are each formed with a second groove 140. The second groove 140 of the first wiring frame 10b is arranged between the first wiring section 13 and the first transmitting lead 14. In a similar way, an upper surface and a lower surface of the second chip-mounting frame 20a are each formed with a third groove 220. The third groove 220 of the second chip-mounting frame 20a is arranged between the second chip-mounting section 21 and the second conductive lead 22. An upper surface and a lower surface of the second wiring frame 20b are each formed with a fourth groove 240. The fourth groove 240 of the second wiring frame 20b is arranged between the second wiring section 23 and the second transmitting lead 24. Preferably, as shown in FIG. 5, the third groove 220 and the fourth groove 240 on the upper surface of the second frame set 20 can be staggered relative to the third groove 220 and the fourth groove 240 on the lower surface of the second frame set 20. As shown in FIG. 6C, to take the third grooves 220 on the second chip-mounting frame 20a as an example, the third groove 220 on the upper surface and the third groove 220 on the lower surface are staggered to each other to provide a tortuous path and thus prevent moisture ingress. On the other words, the length of the path along which the moisture intrudes into the housing 30 from the outside along the leads, if any, is increased, so that the intrusion of the moisture from the outside can be further assuredly prevented, and to increase the reliability of the optical sensor module.

As shown in FIG. 4 and FIG. 5, for further explanation, the first chip-mounting frame 10a further has a first through-hole 110. The first through-hole 110 is formed adjacent to the first groove 120 of the first chip-mounting frame 10a. The second chip-mounting frame 20a further has a second through-hole 210. The second through-hole 210 is formed adjacent to the third groove 220 of the second chip-mounting frame 20a. In this embodiment, the first through-hole 110 and the second through-hole 210 are circular, but are not limited thereto. The first through-hole 110 and the second through-hole 210 can minimize stress generation when bending the leads. Therefore, the present disclosure can prevent stress from being generated when the first conductive lead 12 and the second conductive lead 22 are bending to form the bending section 122, 222, respectively. In addition, the material of the housing 30 can fill in and pass through the first through-hole 110 and the second through-hole 210, as shown in FIG. 6C, so as to increase the combining strength between the housing 30 and the first and second chip-mounting frame 10a, 20a. Further, it can avoid a displacement of the housing 30 relative to the first chip-mounting frame 10a or the second chip-mounting frame 20a, improve the solder wettability and bonding strength of the soldering portion of the lead. Furthermore, the first through-hole 110 and the second through-hole 210 also can prevent the moisture intrusion.

As shown in FIG. 4, to make the chip secure contact with the chip-mounting section, the first chip-mounting frame 10a and the second chip-mounting frame 20a can further include a first dent 118 formed on a top surface of the first chip-mounting section 11 and a second dent 218 formed on a top surface of the second chip-mounting section 21 respectively. The first dent 118 does not pass through the first chip-mounting frame 10a, and the second dent 218 does not pass through the second chip-mounting frame 20a. In this embodiment, the first dent 118 and the second dent 218 are substantially V-shaped grooves. Preferably, the first dent 118 and the second dent 218 are V-groove to form a cross-shaped, which can increase the bonding strength of chip and prevent the bonding paste from overflowing, so as to avoid abnormal electrical connection caused by overflow of the bonding paste and affecting the wiring.

Figure 6A:
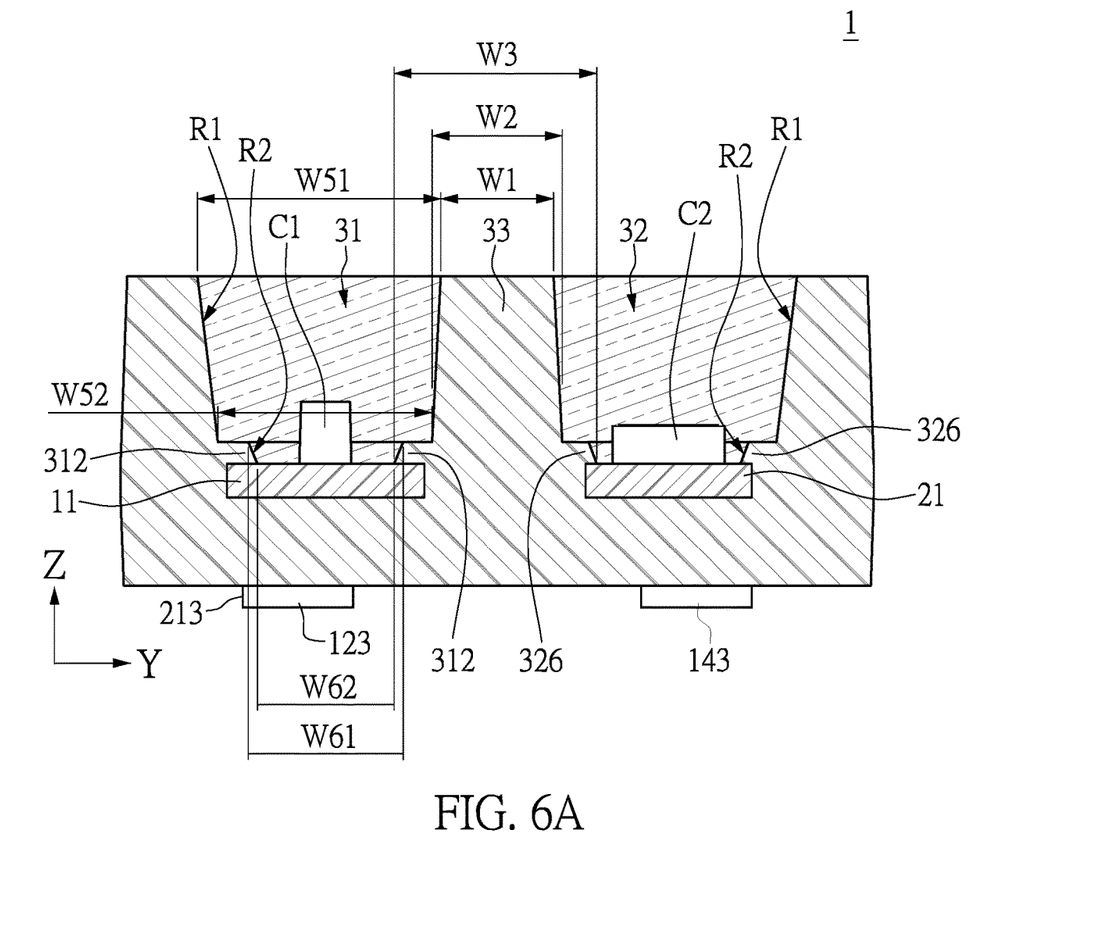
FIG. 6A is a cross-sectional view of the optical sensor module along a VIA-VIA line in FIG. 2 according to the present disclosure.

Reference is made to FIG. 2 and FIG. 6A. FIG. 6A is a cross-sectional view of the optical sensor module along a VIA-VIA line in FIG. 2 according to the present disclosure. The top surface of the first chip-mounting section 11 which is located within the first compartment 31 is partially exposed to the housing 30, the top surface of the second chip-mounting section 21 which is located within the second compartment 32 is partially exposed to the housing 30. The partition wall 33 is arranged between the first chip-mounting section 11 and the second chip-mounting section 21. A width W1 of a top surface of the partition wall 33 is smaller than a width W2 of a root portion of the partition wall 33. The root portion of the partition wall 33 is close to the first chip-mounting section 11 and the second chip-mounting section 21.

Figure 6B:
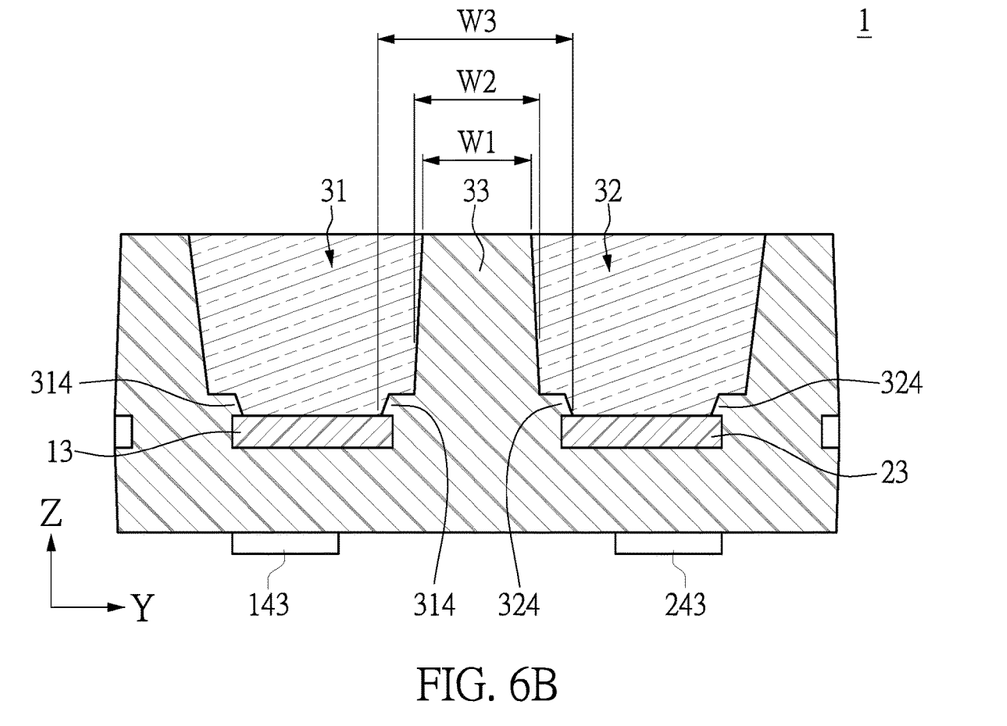
FIG. 6B is a cross-sectional view of the optical sensor module along a VIB-VIB line in FIG. 2 according to the present disclosure.
Figure 6C:
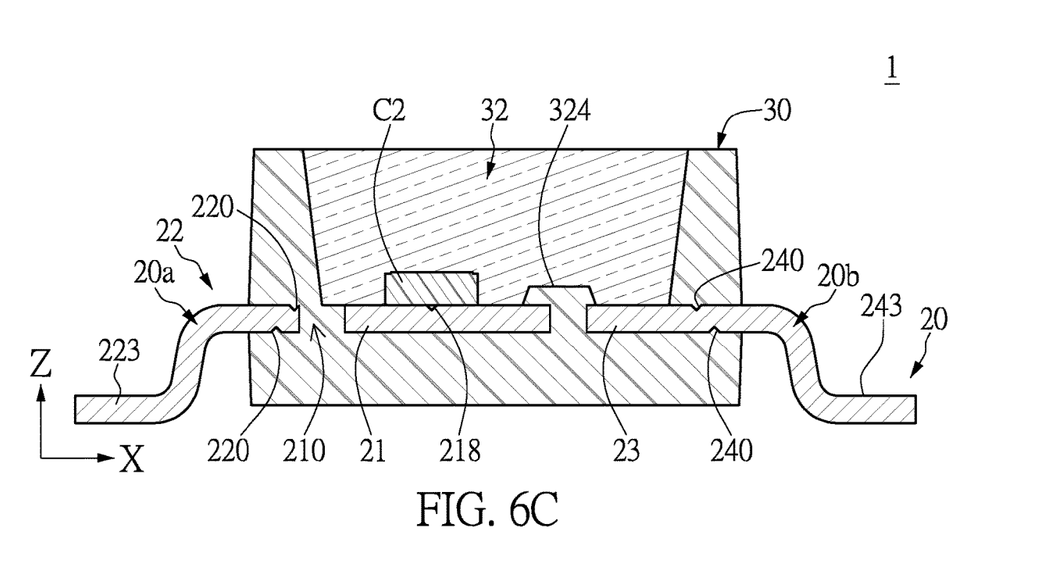
FIG. 6C is a cross-sectional view of the optical sensor module along a VIC-VIC line in FIG. 2 according to the present disclosure.

With reference to FIG. 2, FIG. 6A and FIG. 6B, the housing 30 of this embodiment further includes a plurality of stepped portions 312, 314, 324 and 326. The stepped portions 312, 314, 324 and 326 are formed on a lower inner wall of the housing 30 and extend from a bottom edge of the first compartment 31 and the second compartment 32. In this embodiment, the stepped portion 312 such as a substantially square-shaped, the stepped portion 314 such as a substantially U-shaped, the stepped portion 324 such as a substantially H-shaped, and the stepped portion 326 such as a substantially bump-shaped. In detail, the stepped portion 312 extends inward from a bottom edge of the first compartment 31 to cover a periphery of the top surface of the first chip-mounting section 11, so as to form a shallow, substantially square-shaped cup structure. The stepped portion 314 and the stepped portion 312 are disposed in the first compartment 31 and connect to each other. The stepped portion 314 extends to cover a portion of the top surface of the first wiring frame 10b, so as to form a shallow, substantially U-shaped cup structure. The stepped portion 326 extends inward from a bottom edge of the second compartment 32 to cover two top corners of the second chip-mounting section 21, so as to form two bump-shaped structures. The stepped portion 324 and the stepped portion 326 are positioned in the second compartment 32. The stepped portion 324 extends to cover a portion of the top surface of the second wiring section 23, and another side edge of the second chip-mounting section 21 opposite to the stepped portion 326, so as to form a shallow, substantially H-shaped structure.

Referring to FIG. 6A and FIG. 2, the stepped portions, which are positioned on bottom and opposite sides of the partition wall 33, extend from the root portion of the partition wall 33, so as to form a reverse T-shaped tapered structure, as shown in the cross-sectional view of FIG. 6A. A width W3 of a maximum distance between the two stepped portions (312, 326) at bottom and opposite sides of the partition wall 33 is larger than the width W2 of the root portion of the partition wall 33. Each of the first compartment 31 and the second compartment 32 is gradually tapered off from a top downward along a cross-sectional view to form a cup-like reflector. In addition, the stepped portions (312, 326) along two bottom sides of the partition wall 33 are gradually tapered off downward to form another shallow cup-like reflector, so that the first compartment 31 and the second compartment 32 respectively form an upper cup-like reflector R1 surrounded a lower cup-like reflector R2. In addition, a radial width W51 of the top surface of the upper cup-like reflector R1 is larger than a radial width W52 of the bottom surface of the upper cup-like reflector R1, and a radial width W61 of the top surface of the lower cup-like reflector R2 is larger than a radial width W62 of the bottom surface of the lower cup-like reflector R2, yet the radial width W52 of the bottom surface of the upper cup-like reflector R1 is larger than the radial width W61 of the top surface of the lower cup-like reflector R2. Such structure of this embodiment can enhance the light reflection and intensity, prevent the entrance of moisture into the interior of the optical sensor module 1, and reduce the exposed area of the chip bonding portion of the metal frame. The amount of material, for the housing, which is covered on the frame is increased, so as to strengthen a combining force of the housing and the frame, and reduce the possibility of peeling.

To form the partition wall 33 of reverse T-shaped tapered structure in a cross-sectional view, a thickness of the partition wall 33 close to a bottom part can be increased. In this embodiment, a ratio of width W1 of the top surface of the partition wall 33, width W2 of the root portion of the partition wall 33, and the maximum width W3 between two stepped portions (312, 326) at bottom and opposite sides of the partition wall 33 (W1:W2:W3) is substantially 1:1.2:2, but is not limited thereto. The advantage of the reverse T-shaped tapered structure is that, an infrared ray leakage can be avoided, and an interference of dark current can be reduced, so as to increase the signal-to-noise ratio.

FIG. 6B is a cross-sectional view of the optical sensor module along a VIB-VIB line in FIG. 2 of the present disclosure. As shown in FIG. 6B, the partition wall 33 between the first wiring section 13 and the second wiring section 23 is configured like that shown in FIG. 6A. In detail, the partition wall 33 extends downward in a shape of reverse T-shaped tapered structure. A width W1 on a top surface of the partition wall 33, a width W2 of the root portion of the partition wall 33, a width W3 between two stepped portions (314, 324) located a bottom and opposite sides of the partition wall 33 are arranged in the ratio of 1:1.2:2. However, the present disclosure is not limited thereto.

Reference is made to FIG. 6C, which illustrates a cross-sectional view of the optical sensor module along a longitudinal direction of the second frame set according to the present disclosure. A part of the stepped portion 324, which is along the Y-axis direction, protrudes between the second chip-mounting section 21 and the second wiring section 23, and crosses over the second compartment 32 along a Y-axis direction perpendicular to the longitudinal direction (X-axis) of the second frame set 20. A part of the stepped portion 324 extends left to cover the top surface of the second chip-mounting section 21 and extends right to cover the top surface of the second wiring section 23, thus forming in a rivet shape in a cross-sectional view. Such configuration can strengthen the combination of the housing 30 and the second frame set 20, and provides a tortuous path to prevent moisture ingress, so as to extend the product life.

Figure 7A:
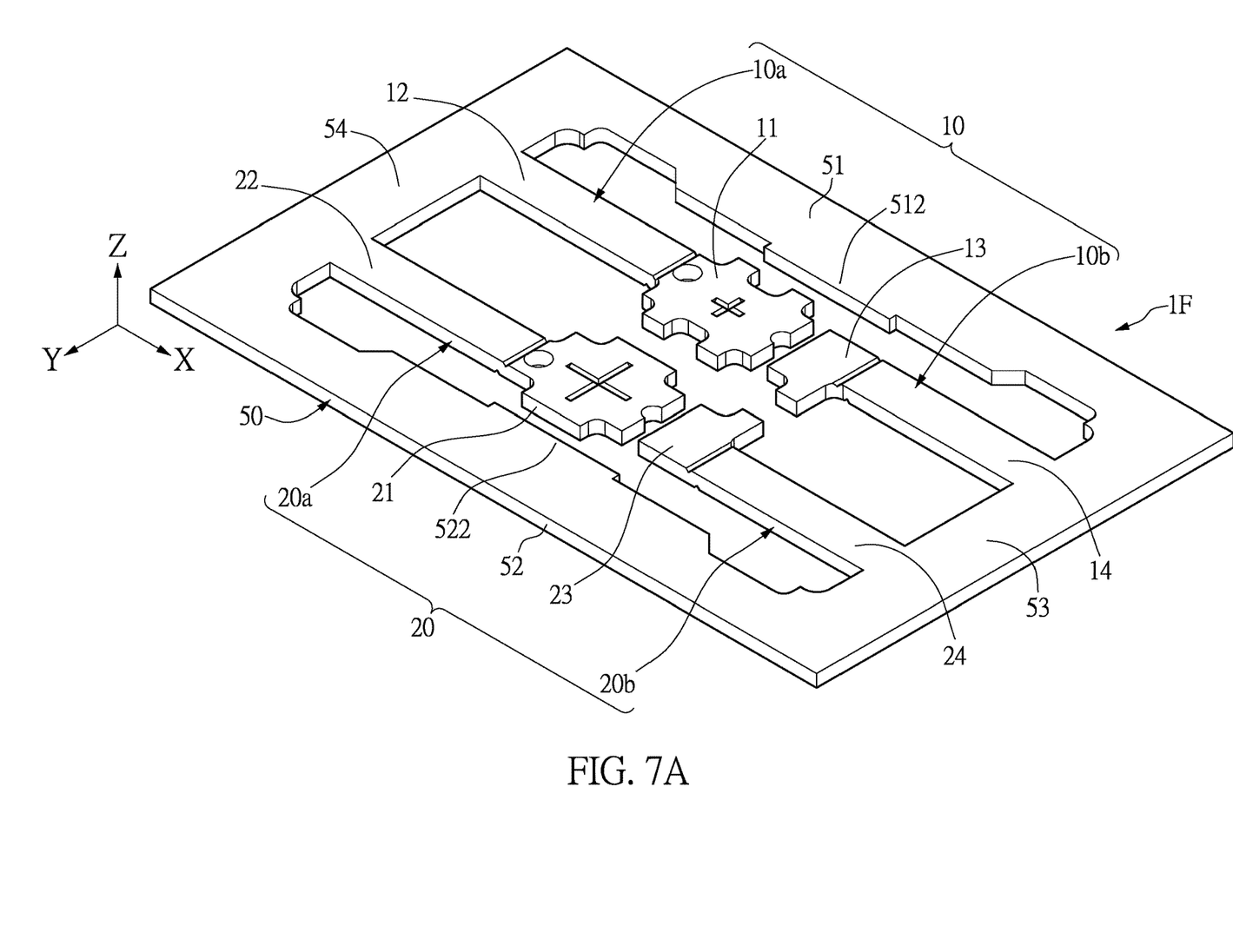
FIG. 7A is a schematic view of punching a frame structure of the optical sensor module according to the present disclosure.

The present disclosure further provides a method for manufacturing an optical sensor module, which includes steps as follows:

Reference is made to FIG. 7A, which illustrates a stamping step according to the present disclosure. A metal plate is stamped to form a first frame set 10 and a second frame set 20 while leaving a joint frame 50 in such a condition as to interconnect respective distal ends of the first and second frame sets 10 and 20. The first frame set 10 includes a first chip-mounting frame 10a and a first wiring frame 10b. The second frame set 20 includes a second chip-mounting frame 20a and a second wiring frame 20b. The joint frame 50 has of four rectilinear members. The two intersecting pairs of parallel members of joint frame 50 are denoted as members 51 and 52 and 53 and 54. In addition, the joint frame 50 further includes a plurality of retaining tabs 512, 522. A plurality of substantially rectangular-shaped tabs 512, 522 extend from the members 51 and 52 of the joint frame 50 toward the first and second frame sets 10 and 20 without contacting the first and second frame sets 10 and 20.

In particular, FIG. 7A illustrates a perspective view of the frame structure of the optical sensor before trimming of the present disclosure. During a stamping step of the manufacturing process, the present disclosure can form a plurality of frame structures at one time. FIG. 7A only shows one frame structure 1F as one example of the optical sensor module. A metal sheet is stamped to form the joint frame 50, the first frame set 10 and the second frame set 20 in one stamping step. The joint frame 50 connects the first frame set 10 and the second frame set 20. In detail, the joint frame 50 has two longitudinal members 51, 52 along a longitudinal direction and two transverse members 53, 54 along a direction perpendicular to the longitudinal direction. The first transmitting lead 14 of the first wiring frame 10b and the second transmitting lead 24 of the second wiring frame 20b connect to the transverse member 53. The first conductive lead 12 of the first chip-mounting frame 10a and the second conductive lead 22 of the second chip-mounting frame 20a connect to the transverse member 54. In addition, the joint frame 50 has a retaining tab 512 which protrudes from the longitudinal member 51 toward the first frame set 10, and a retaining tab 522 which protrudes from the longitudinal member 52 toward the second frame set 20. The number of the retaining tab can be one or more, but is not limited thereto, and is used to fix the housing 30 in place temporarily during the injection molding process.

Figure 7B:
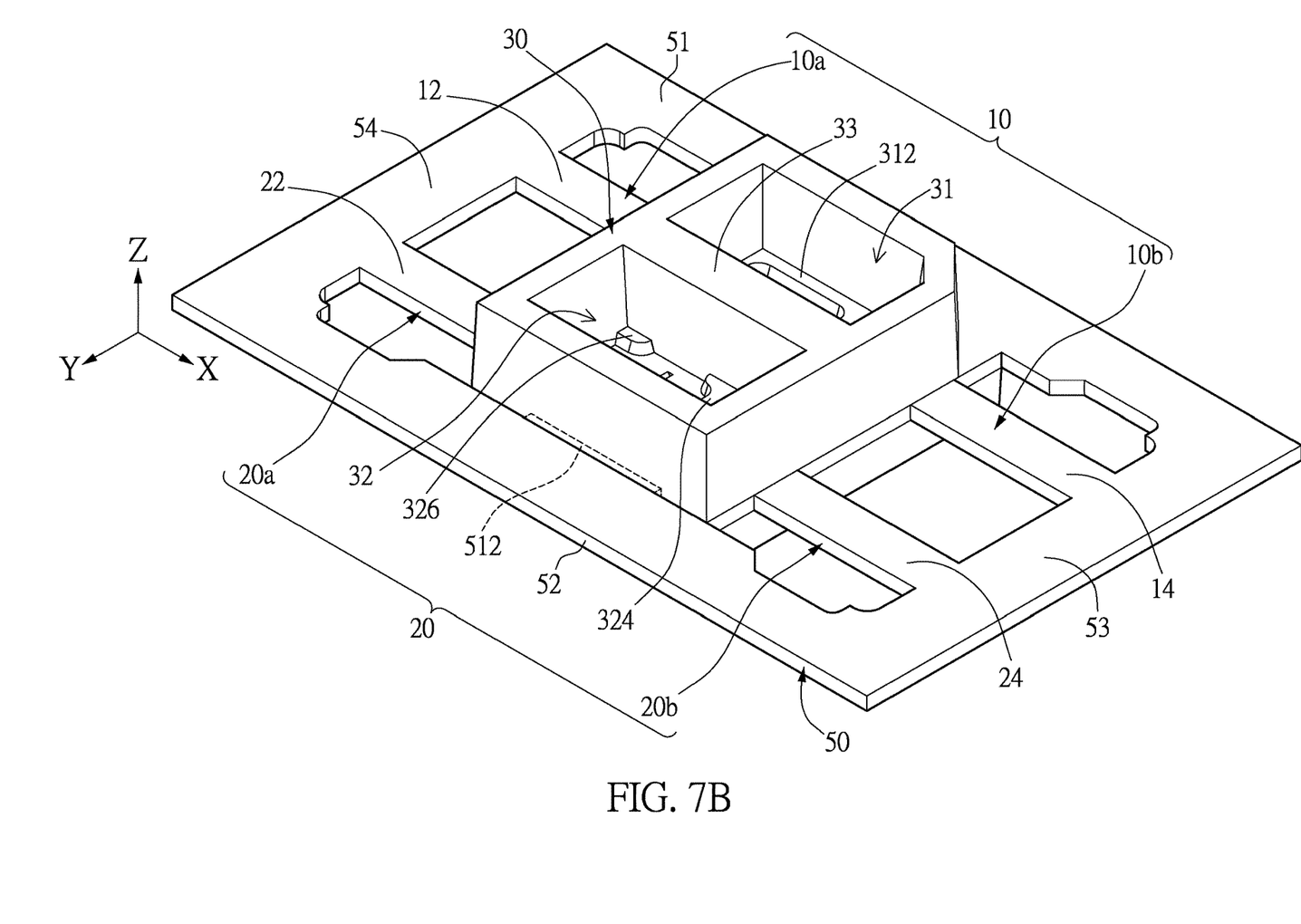
FIG. 7B is a schematic view of molding a housing of the optical sensor module according to the present disclosure.

Reference is made to FIG. 7B, which illustrates a step of injection molding according to the present disclosure. The housing 30 is formed by the injection molding process with an opaque material, such as PPS (Polyphenylene Sulfide), PC (Polycarbonate), PMMA (Polymethyl methacrylate), ABS (Acrylonitrile Butadiene Styrene). The housing 30 partially covers the first frame set 10 and the second frame set 20, thereby exposing the top surface of the first chip-mounting section 11 and the second chip-mounting section 21 partially. The housing 30 does not, however, cover the first transmitting lead 14, the second transmitting lead 24, the first conductive lead 12 and the second conductive lead 22 as shown in FIG. 7B. In detail, the over-molded housing 30 includes the first compartment 31, the second compartment 32, the partition wall 33 divided the first compartment 31 from the second compartment 32, and the stepped portions 312, 314, 326, 324. In this step, the retaining tabs 512, 522 can be coupled to, e.g., insert molded into, the housing 30. In other words, the retaining tabs 512, 522 are inserted into two opposite sides of the housing 30, which are shielded in FIG. 7B (as shown by the dashed line). By virtue of the above configuration, the present disclosure has advantages as follows. The width of each member of the joint frame 50 is reduced, so as to increase the arrangement denseness of the housing 30 on the joint frame 50, and reduce the cost. Further, it can enhance the stability of combination between the housing 30 and the frame structure 1F.

Figure 7C:
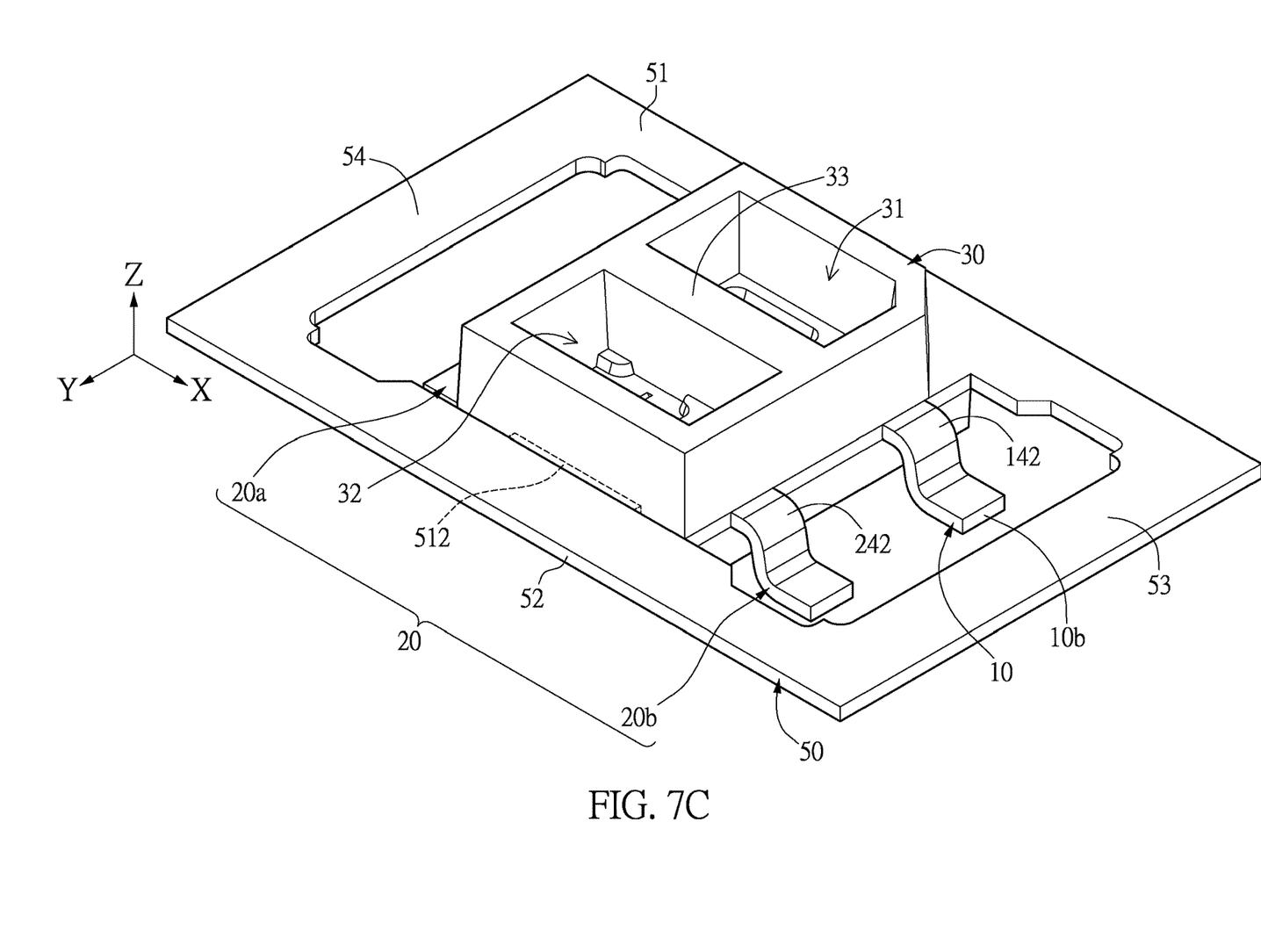
FIG. 7C is a schematic view of a trimming and shaping step of the frame structure of the optical sensor module according to the present disclosure.

Reference is made to FIG. 7C, which illustrates a step of trimming and forming according to the present disclosure. The first transmitting lead 14, the second transmitting lead 24, the first conductive lead 12 and the second conductive lead 22 are separated from the two transverse members 53, 54 of the joint frame 50 by a means of cutting. The first conductive lead 12, the first transmitting lead 14, the second conductive lead 22, and the second transmitting lead 24 (free ends of the first chip-mounting frame 10a, the first wiring frame 10b, the second chip-mounting frame 20a, and the second wiring frame 20b) are formed with a bending section 122, 142, 222, 242, respectively, as shown in FIG. 4, and FIG. 7C.

The above structure of this embodiment has advantages as follows. It can minimize stress generation when bending the leads of the frames of this embodiment, and prevent the housing 30 from peeling off the first frame set 10, or the second frame set 20. In addition, the above configuration can reduce the amount of metal material used in the first frame set 10 and the second frame set 20, so that it is more lightweight.

According to practical requirements, the first frame set 10 and the second frame set 20 in another embodiment can be straight without being bent. In other words, the first chip-mounting frame 10a, the first wiring frame 10b, the second chip-mounting frame 20a, and the second wiring frame 20b are planar-shaped similar to that shown in FIG. 7A. Such structure configuration of the optical sensor module can be disposed in an accommodating space of a printed circuit board (not shown), such as a concave structure, a side recessed part, or an opening of the printed circuit board. The first chip-mounting frame 10a, the first wiring frame 10b, the second chip-mounting frame 20a, and the second wiring frame 20b are soldered on a top surface of the printed circuit board (not shown).

Figure 7D:
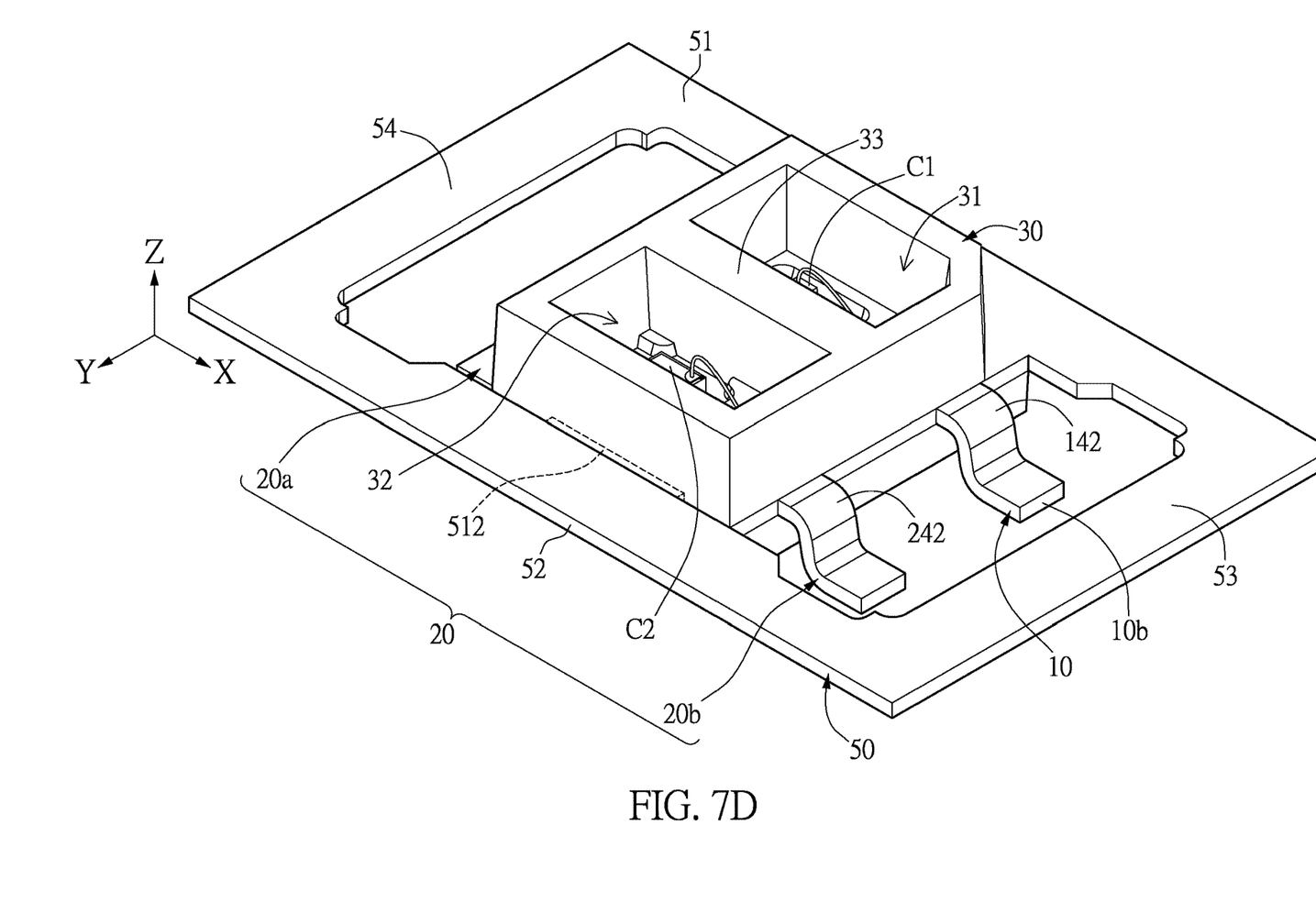
FIG. 7D is a schematic view of chip-bonding and wiring step of the optical sensor module according to the present disclosure.

Reference is made to FIG. 7D, which illustrates a step of disposing chip and wire bonding according to the present disclosure. The light source element C1 is disposed on the first chip-mounting frame 10a of the first frame set 10. The light detector C2 is disposed on the second chip-mounting frame 20a of the second frame set 20. In detail, the light source element C1 and the light detector C2 can be positioned on the first dent 118 and the second dent 218, respectively. Then, the light source element C1 is connected to the first wiring frame 10b, and the second chip C2 is connected to the second wiring frame 20b by a means of wire bonding.

Figure 7E:
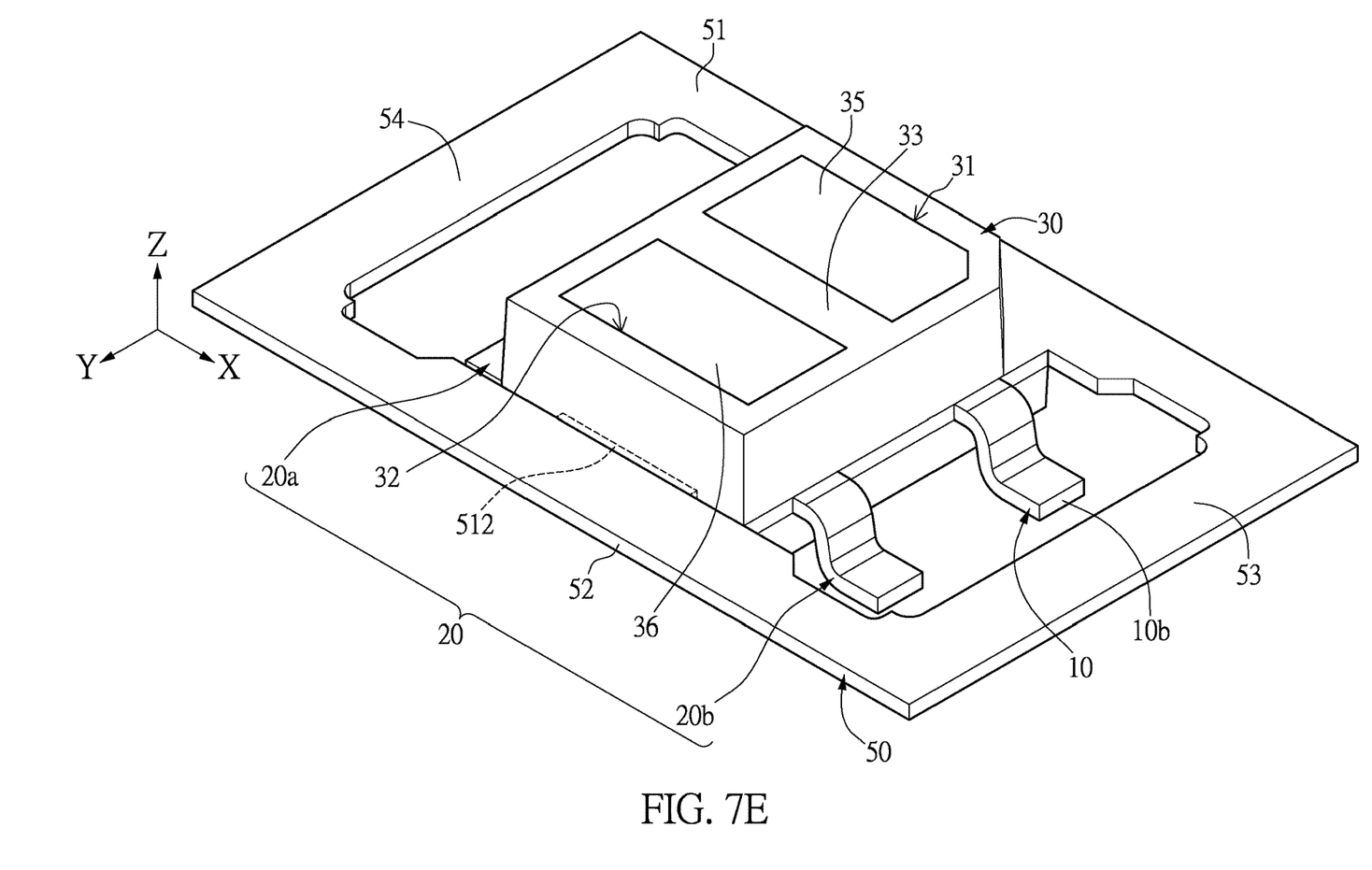
FIG. 7E is a schematic view of an encapsulating step of the optical sensor module according to the present disclosure.

Reference is made to FIG. 7E, which illustrates a step of filling encapsulating material of the present disclosure. A first encapsulating material 35 is filled in the first compartment 31, and a second encapsulating material 36 is filled in the second compartment 32 until the first and second compartments 31, 32 are filled. Therefore, the surfaces of the light source element C1 and the light detector C2 are covered (encapsulated or potted) with the first and second encapsulating materials 35 and 36, for example a silicone, an epoxy resin, a (meth)acrylate or a polymeric material which are substantially translucent or transparent.

Finally, in a separation step, to separate the optical sensor module away from the joint frame 50. Since the retaining tabs 512, 522 are temporarily inserted into the sides of the housing 30, the completed optical sensor module can be pushed to be separated away from the joint frame 50, as shown in FIG. 1 and FIG. 6B, without any more trimming. It should be noted that the retaining tabs 512, 522 only partially inserts into the sides of the housing 30, and forms a shallow groove, which does not extend inwardly to the first and second frame sets 10 and 20, so as to avoid moisture intrusion.

The manufacturing method of the present disclosure has advantages as follows. After the trimming and forming step, the chips are disposed at their respective positions, wire bonded, and then the encapsulant is filled. In other words, the step of disposing chip and wire bonding are performed after the step of trimming and forming, so that the chips are not affected by stress when bending the bending section, and the encapsulant is prevented from peeling off, without any problems of reliability. Further, the joint frame has a plurality of retaining tabs which can hold the housing in place, so as to increase the arrangement denseness of the housings, and simplify the manufacturing steps.

In conclusion, by virtue of the reverse T-shaped tapered configuration of the partition wall, the optical sensor module of the present disclosure can avoid leakage of infrared ray, reduce interference signals of dark current, and increase the signal-to-noise ratio, so that the errors detected from interference signals can be reduced. The frame structure of the present disclosure can provide a relatively long, tortuous moisture path and increase the combining strength between the housing and the frame structure. In addition, by virtue of the housing, including the stepped portions, of the present disclosure can block light, and establish a relatively long, tortuous moisture path, so as to slow down the intrusion of moisture, enhance the moisture-proof ability, and extend the product life.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A frame structure of an optical sensor module, comprising:
   a first frame set including a first chip-mounting frame and a first wiring frame, wherein the first chip-mounting frame has a first chip-mounting section, and a first conductive lead extending from the first chip-mounting section along a longitudinal direction, wherein the first wiring frame has a first wiring section, and a first transmitting lead extending from the first wiring section along the longitudinal direction; and
   a second frame set including a second chip-mounting frame and a second wiring frame, wherein the second chip-mounting frame has a second chip-mounting section, and a second conductive lead extending from the second chip-mounting section along the longitudinal direction, wherein the second wiring frame has a second wiring section, and a second transmitting lead extending from the second wiring section along the longitudinal direction;
   wherein the first wiring frame has a first protrusion partially protruding from the first wiring section toward the second wiring frame perpendicular to the longitudinal direction, and the second wiring frame has a second protrusion partially protruding from the second wiring section toward the first wiring frame perpendicular to the longitudinal direction;
   wherein a corner of the first chip-mounting section adjacent to the first protrusion forms a first arc notch, and a corner of the second chip-mounting section adjacent to the second protrusion forms a second arc notch, so as to form an opening cooperatively defined by the first protrusion, the second protrusion, the first arc notch and the second arc notch.

2. The frame structure of the optical sensor module according to claim 1, wherein the second chip-mounting section has four corners, and each of the corners forms the second arc notch, such that the second chip-mounting section is cross-shaped; wherein the first chip-mounting section has four corners, and each of the corners forms the first arc notch; wherein the first chip-mounting section has two longitudinal side edges parallel to the longitudinal direction, and each of the longitudinal side edges of the first chip-mounting section forms a side arc notch, such that the first chip-mounting section is double-cross-shaped.

3. The frame structure of the optical sensor module according to claim 1, wherein the first chip-mounting section has a transverse side edge facing the first wiring frame, and the transverse side edge of the first chip-mounting section forms a third arc notch; wherein the second chip-mounting section has a transverse side edge facing the second wiring frame, and the transverse side edge of the second chip-mounting section forms a fourth arc notch.

4. The frame structure of the optical sensor module according to claim 1, wherein the first wiring frame is substantially L-shaped; wherein the second wiring frame is substantially L-shaped.

5. The frame structure of the optical sensor module according to claim 1, wherein an upper surface and a lower surface of the first chip-mounting frame are each formed with a first groove in a staggered manner, the first groove of the first chip-mounting frame is arranged between the first chip-mounting section and the first conductive lead; wherein an upper surface and a lower surface of the first wiring frame are each formed with a second groove in a staggered manner, the second groove of the first wiring frame is arranged between the first wiring section and the first transmitting lead; wherein an upper surface and a lower surface of the second chip-mounting frame are each formed with a third groove in a staggered manner, the third groove of the second chip-mounting frame is arranged between the second chip-mounting section and the second conductive lead; wherein an upper surface and a lower surface of the second wiring frame are each formed with a fourth groove in a staggered manner, the fourth groove of the second wiring frame is arranged between the second wiring section and the second transmitting lead.

6. The frame structure of the optical sensor module according to claim 5, wherein the first chip-mounting frame further has a first through-hole, and the first through-hole is formed in proximity of the first grooves of the first chip-mounting frame; wherein the second chip-mounting frame further has a second through-hole, and the second through-hole is formed in proximity of the third grooves of the second chip-mounting frame.

7. The frame structure of the optical sensor module according to claim 6, wherein the first conductive lead and the first transmitting lead respectively form a bending section, so that a first connecting section formed at free end of the first conductive lead and a second connecting section formed at free end of the first transmitting are not coplanar with the first chip-mounting section; wherein the second conductive lead and the second transmitting lead respectively form a bending section, so that a third connecting section formed at free end of the second conductive lead and a fourth connecting section formed at free end of the second transmitting lead are not coplanar with the second chip-mounting section.

8. The frame structure of the optical sensor module according to claim 6, wherein a top surface of the first chip-mounting section has a first dent being cross-shaped, and a top surface of the second chip-mounting section has a second dent being cross-shaped.

9. The frame structure of the optical sensor module according to claim 8, further comprising a joint frame, wherein the joint frame has two longitudinal members and two transverse members perpendicular to the longitudinal members, the two transverse members are connected to the first frame set and the second frame set, and each of the two longitudinal members of joint frame has at least one retaining tab protruding toward the first frame set and the second frame set.

10. An optical sensor module, comprising:
a frame structure, including:
a first frame set including a first chip-mounting frame and a first wiring frame, wherein the first chip-mounting frame has a first chip-mounting section, and the first wiring frame has a first wiring section; and
a second frame set including a second chip-mounting frame and a second wiring frame, wherein the second chip-mounting frame has a second chip-mounting section, and the second wiring frame has a second wiring section;
a light source element disposed on the first chip-mounting section of the first chip-mounting frame;
a light detector disposed on the second chip-mounting section of the second chip-mounting frame; and
a housing defining a first transparent window and a second transparent window, wherein the first transparent window is corresponding to the light source element and the second transparent window is corresponding to the light detector;
wherein the housing defines a first compartment, a second compartment and a partition wall between the first compartment and the second compartment; the light source element is located in the first compartment, and the light detector is located in the second compartment;
wherein a width of a top portion of the partition wall is smaller than a width of a root portion of the partition wall.

11. The optical sensor module according to claim 10, wherein the housing covers a portion of the first chip-mounting section, the first wiring section, the second chip-mounting section, and the second wiring section, to expose the light source element within the first compartment and the light detector within the second compartment; wherein the partition wall is arranged between the first compartment and the second compartment, and the root portion is located in proximity of the first chip-mounting section and the second chip-mounting section.

12. The optical sensor module according to claim 11, wherein the housing further has a plurality of stepped portions, the stepped portions extend inward from a bottom edge of the first compartment and the second compartment of the housing, and the stepped portions extends and partially covers an upper surface of the first chip-mounting section, the second chip-mounting section, the first wiring section and the second wiring section, wherein a maximum width between the stepped portions at bottom and opposite sides of the partition wall is larger than a width of the root portion of the partition wall.

13. The optical sensor module according to claim 12, wherein a ratio of a width of the top surface of the partition wall, a width of the root portion of the partition wall, and a maximum width between the stepped portions at bottom and opposite sides of the partition wall is substantially 1:1.2:2.

14. The optical sensor module according to claim 12, wherein the first chip-mounting frame and the first wiring frame are spaced from each other by a distance.

15. The optical sensor module according to claim 14, wherein the second chip-mounting frame and the second wiring frame are spaced from each other by a distance.

16. A method of manufacturing an optical sensor module, comprising steps as follows:
a stamping step, stamping a metal sheet to form a joint frame, a first frame set, and a second frame set; wherein the first frame set includes a first chip-mounting frame and a first wiring frame, and the second frame set includes a second chip-mounting frame and a second wiring frame; wherein the joint frame forms a plurality of retaining tabs extending inward;
an injection molding step, injecting an insulated material to form a housing, and the housing partially covering the first frame set and the second frame set to form a first compartment, a second compartment and a partition wall located between the first compartment and the second compartment, wherein the housing covers the retaining tabs, and the retaining tabs insert into sides of the housing;
a trimming and forming step, separating the first frame set and the second frame set away from the joint frame;
a bonding and wiring step, disposing a light source element on the first chip-mounting frame of the first frame set, disposing a light detector on the second chip-mounting frame of the second frame set, and wiring to connect the light source element to the first wiring frame, and connecting the light detector to the second wiring frame;
an encapsulating step, filling a first encapsulating material in the first compartment, and filling a second encapsulating material in the second compartment; and
a separating step, pushing the housing away from the retaining tab of the joint frame.

17. The method according to claim 16, wherein the trimming and forming step further includes a step of bending the first chip-mounting frame, the first wiring frame, the second chip-mounting frame and the second wiring frame, so as to form a bending section, respectively.

\* \* \* \* \*